United States Patent
Heikkinen et al.

(10) Patent No.: US 8,378,748 B2
(45) Date of Patent: Feb. 19, 2013

(54) AMPLIFIER

(75) Inventors: Jari Johannes Heikkinen, Espoo (FI); Jonne Juhani Riekki, Espoo (FI); Jouni Kristian Kaukovuori, Vantaa (FI)

(73) Assignee: Renesas Mobile Corporation, Tokyo (JP)

( * ) Notice: Subject to any disclaimer, the term of this patent is extended or adjusted under 35 U.S.C. 154(b) by 0 days.

(21) Appl. No.: 13/111,423

(22) Filed: May 19, 2011

(65) Prior Publication Data

US 2012/0293262 A1    Nov. 22, 2012

(51) Int. Cl.
*H03F 3/45* (2006.01)

(52) U.S. Cl. .................... 330/260; 330/51; 330/283

(58) Field of Classification Search .......... 330/51, 330/260, 283, 277, 282, 291, 294, 302
See application file for complete search history.

(56) References Cited

U.S. PATENT DOCUMENTS

| | | | | |
|---|---|---|---|---|
| 6,094,084 A | 7/2000 | Abou-Allam et al. | ........ | 327/359 |
| 6,175,274 B1 | 1/2001 | Groe | ................ | 330/51 |
| 6,768,377 B2 | 7/2004 | Macedo | ........................ | 330/51 |
| 6,933,779 B2 | 8/2005 | Lee et al. | ........................ | 330/51 |
| 6,949,979 B2 | 9/2005 | Lu et al. | ........................ | 330/305 |
| 7,002,411 B2* | 2/2006 | Yeh | ................ | 330/254 |
| 7,084,707 B2 | 8/2006 | Razavi et al. | ................ | 330/302 |
| 7,164,318 B2* | 1/2007 | Costa et al. | ................ | 330/283 |
| 7,187,239 B2* | 3/2007 | Yeh | ................ | 330/311 |
| 7,266,360 B2 | 9/2007 | Kang et al. | ................ | 455/302 |
| 7,323,939 B2 | 1/2008 | Han et al. | | |
| 7,474,158 B1 | 1/2009 | Yim et al. | ................ | 330/311 |
| 7,495,515 B1 | 2/2009 | Branch et al. | ................ | 330/305 |
| 7,595,693 B2 | 9/2009 | Wiklund | ................ | 330/282 |
| 7,622,989 B2 | 11/2009 | Tzeng et al. | ................ | 330/126 |
| 7,633,345 B2 | 12/2009 | Zhan | ................ | 330/295 |
| 7,656,229 B2 | 2/2010 | Deng et al. | ................ | 330/149 |
| 7,679,436 B2 | 3/2010 | Jimenez et al. | | |
| 7,679,446 B2* | 3/2010 | Kim et al. | ................ | 330/282 |
| 7,714,657 B2* | 5/2010 | Wu | ................ | 330/311 |
| 7,843,270 B2 | 11/2010 | Li et al. | ................ | 330/295 |
| 8,102,214 B2* | 1/2012 | Park et al. | ................ | 330/291 |
| 2005/0068106 A1 | 3/2005 | Irvine | ................ | 330/260 |
| 2006/0132242 A1 | 6/2006 | Han et al. | | |
| 2010/0237947 A1 | 9/2010 | Xiong et al. | ................ | 330/278 |

(Continued)

FOREIGN PATENT DOCUMENTS

| | | |
|---|---|---|
| CN | 101834576 A | 9/2010 |
| CN | 101951229 | 1/2011 |

(Continued)

OTHER PUBLICATIONS

Bruccoleri, et al., "Wide-Band CMOS Low-Noise Amplifier Exploiting Thermal Noise Cancelling", IEEE Journal of Solid-State Circuits, vol. 39, No. 2, (Feb. 2004), (pp. 275-282).

(Continued)

*Primary Examiner* — Khanh V Nguyen
(74) *Attorney, Agent, or Firm* — Lucas & Mercanti LLP; Robert P. Michal

(57) ABSTRACT

The invention relates to a configurable low noise amplifier circuit which is configurable between a first topology in which the low noise amplifier circuit includes a degeneration inductance whereby the low noise amplifier circuit operates as an inductively degenerated low noise amplifier, and a second topology in which the low noise amplifier circuit includes a feedback resistance whereby the low noise amplifier circuit operates as a resistive feedback low noise amplifier.

23 Claims, 7 Drawing Sheets

U.S. PATENT DOCUMENTS

2010/0321113 A1    12/2010    Kathiresan et al. ............ 330/278
2010/0328546 A1    12/2010    Rafi et al.
2011/0003563 A1     1/2011    Gorbachov ..................... 455/78

FOREIGN PATENT DOCUMENTS

| EP | 1 993 201 A1 | 11/2008 |
|---|---|---|
| JP | 2010087954 A | 4/2010 |
| KR | 101019716 B1 | 7/2010 |
| KR | 20100077726 A | 7/2010 |
| KR | 101019716 B | 3/2011 |
| WO | WO 2007/085866 A1 | 8/2007 |

OTHER PUBLICATIONS

EP Combined Search and Examination Report under Sections 17 and 18(3) issued for corresponding GB Patent Application No. GB1117607.0 mailed Jan. 27, 2012.

EP Combined Search and Examination Report under Sections 17 and 18(3) issued for corresponding GB Patent Application No. GB1117608.8 mailed Feb. 8, 2012.

Bruccoleri, Federico, et al. *Wide-Band CMOS Low-Noise Apmplifier Exploiting Thermal Noise Canceling*; IEEE Journal of Solid-State Circuits, vol. 39, No. 2, Feb. 2004, pp. 275-282.

Liao, C-F., et al., "A Broadband Noise-Canceling CMOS LNA for 3.1-10.6-GHz UWB Receivers", © 2007 IEEE, pp. 329-339.

Shaeffer, D.K., et al., "A 1.5-V, 1.5-GHz CMOS Low Noise Amplifier", © 1997 IEEE, pp. 745-759.

Notice of References Cited, issued in related U.S. Appl. No. 13/556,552 on Sep. 6, 2012 (1 page).

Communication entitled "Patents Act of 1977: Entitlement to earlier date under Section 15(9)", dated Aug. 20, 2012, issued by the U.K, Patent Office in related U.K. Application No. GB1207237.7 (2 pages).

Che-Sheng Chen, et al., "A 2.5GHz 90nm CMOS Triple Gain Mode LNA for WiMAX Applications," International Symposium on Signals, Systems and Electronics, ISSSE' 07, pp. 367-369 (3 pages).

Combined Search and Examination Report under Sections 17 and 18(3) dated Aug. 10, 2012 issued by the U.K. Patent Office in related U.K. Application GB1206423.4 (4 pages).

\* cited by examiner

AMPLIFIER

FIELD OF THE INVENTION

This invention relates to low noise amplifiers. In particular, but not exclusively, this invention relates to configurable low noise amplifier circuits.

BACKGROUND OF THE INVENTION

Radio frequency receivers can be configured to operate within a number of different radio frequency bands. For example a receiver for a mobile station (or cellular telephony device) can be configured to operate within any of the following bands: Global System for Mobile Communications (GSM), 850, 900, 1800, and/or 1900, Wideband Code Division Multiple Access (WCDMA), High Speed Packet Access (HSPA) and/or Long Term Evolution (LTE) Bands 1, 2, 3, etc. This allows a mobile station containing such a receiver to be used in different areas where varying subsets of the above radio frequency bands are supported (e.g. to enable roaming).

Receivers typically incorporate one or more Radio-Frequency Integrated Circuits (RFICs) including a Low Noise Amplifier (LNA) as the first amplifying stage in the receiver. For example, one or more LNAs are typically used to amplify the radio frequency signals gathered by an antenna, and the amplified signals generated by the LNA(s) are then used by other components in the receiver.

Receivers typically include one or more radio frequency (RF) filters located between the antenna and the LNA(s) that form the first amplifying stage of the receiver. FIG. 1 illustrates an exemplary receiver comprising an RF module 100 and antenna 130. RF module 100 comprises an RF Front End Module 132 which in turn includes one or more (up to a total of n) RF filters 110-112 that filter radio frequency signals gathered by antenna 130. RF module 100 also comprises an RFIC 134 which in turn comprises one or more (up to a total of m) LNAs 120-122 that amplify the filtered signals generated by the RF filters 110-112.

As is known from Friis' formula for noise factor, the LNA that forms the first amplifying stage of a receiver dominates the noise figure of the receiver. The LNA that forms the first stage also has a key role in determining the input impedance of the receiver. The input impedance of this LNA must be carefully matched to a certain impedance, as otherwise the performance of an RF filter (e.g. 110-112) preceding the LNA will be degraded. Additionally, an RF filter preceding the LNA will typically have a fixed frequency range which requires the inputs of the LNA to also be matched to that frequency range.

As a result, depending on the LNA structure, it may be necessary to utilize matching components external to the RFIC containing the LNA to appropriately set the input impedance and frequency range matching. However, these external matching components can be expensive, and in some cases it is preferable to use an LNA with internal matching capabilities to appropriately set its input impedance and frequency range matching.

Another measure of receiver performance is its sensitivity (reference sensitivity level), which measures the minimum detectable signal level at the receiver input. The signal quality of the received signal is typically determined by bit error rate or throughput. The sensitivity level S is determined by the equation:

$$S = -174 \text{ dBm/Hz} + 10 \log(BW) + SNR_{min} + NF \quad (1)$$

where −174 dBm/Hz is the available noise power density from an input source at a temperature of 290 K, BW is the channel bandwidth, $SNR_{min}$ is the required signal-to-noise ratio, and NF is the receiver noise figure. The $SNR_{min}$ depends on the targeted bit error rate and the modulation method used, for example.

The RF filter preceding the LNA that forms the first amplifying stage in a receiver may have significant insertion loss in some of the radio frequency bands within which the receiver is configured to operate. The insertion loss can cause the receiver to be less sensitive and have a higher noise figure for these radio frequency bands. Since the receiver sensitivity in these radio frequency bands is worse, the range between the transmitter and the receiver over which the receiver may be required to operate is reduced, thus making the cellular network design more challenging and more expensive. In addition, the size of the antenna connected to the receiver may be limited due to space constraints in devices such as mobile stations, thus restricting the performance of the antenna; this is exacerbated at lower frequencies, for example below 1 GHz, where the size of an antenna tends to become larger due to the longer wavelength. The receiver capability can therefore be degraded leading to decreased link performance.

To mitigate the above effects, the LNA noise figure should be as good as possible. However, achieving good noise performance without using external matching components prior to the LNA and with adequate current consumption is a challenging task. Additionally, as well as the expensive and size consuming external components, the cost of the RFIC containing the LNA must also be considered. To keep the semiconductor die area of the RFIC small, the number of on-chip inductors should be kept at a minimum, because high quality inductors require significant die area and their size does not downscale along with reductions in the features widths of integrated circuits.

From the above it can be seen that there are a number of different design factors to be considered when designing an LNA, and that accommodating some or all of these factors simultaneously can prove difficult. There is therefore a need to enhance LNA design by providing improved ways of accommodating various design factors.

SUMMARY OF THE INVENTION

In accordance with a first aspect of the present invention, there is provided a configurable low noise amplifier circuit, said low noise amplifier circuit being configurable between one of a first topology in which said low noise amplifier circuit comprises a degeneration inductance whereby said low noise amplifier circuit operates as an inductively degenerated low noise amplifier and a second topology in which said low noise amplifier circuit comprises a feedback resistance whereby said low noise amplifier circuit operates as a resistive feedback low noise amplifier. Hence, the present invention allows provision of either inductively degenerated low noise amplifier functionality or resistive feedback low noise amplifier functionality via a single low noise amplifier circuit. Only a single instance of components common to both of the topologies is required and such component re-use helps to reduce the cost and die area.

In an embodiment of the invention, the circuit comprises a switching arrangement and is configurable between one of the first topology and the second topology via the switching arrangement. Hence, the circuit can be configured in either an inductively degenerated topology or a resistive feedback topology according to the desired performance of the circuit.

In one embodiment of the invention, the low noise amplifier comprises a first input transistor, and the degeneration inductance comprises a degeneration inductor connected between a first output terminal of the first input transistor and ground. Hence, the invention provides a low noise amplifier topology with associated good noise figure and sensitivity performance. Impedance matching is provided via the degeneration inductance and one or more external matching components.

In another embodiment of the invention, the low noise amplifier comprises a first input transistor, and the feedback resistance comprises a feedback resistor connected between the input terminal of the first input transistor and a first output of the circuit. In this topology, impedance matching is provided via the internal feedback resistance with no requirement for matching using external matching components.

In some embodiments of the invention, the switching arrangement comprises a first topology switching means (or function) connected between a first output terminal of the first input transistor and ground, and a second topology switching means (or function) connected between the input terminal of the first input transistor and the feedback resistor. The circuit is configurable in the first topology by configuring the first and second topology switching means in an open state, and the circuit is configurable in the second topology by configuring the first and second topology switching means in a closed state.

In arrangements of the invention, the first and/or the second topology switching means comprise switching transistors, each of the switching transistors is configurable in the open state via input of an open state control signal to the input terminal of the respective switching transistor, and each of the switching transistors is configurable in the closed state via input of a closed state control signal to the input terminal of the respective switching transistor. Hence, the topology of the circuit can be conveniently configured by applying appropriate control signals, for example digital control signals, to a number of switching transistors within the circuit.

In embodiments of the invention, the circuit comprises a first cascode transistor connected to a second output terminal of the first input transistor and the first output of the circuit. Hence, undesired amplification of the input capacitance of the first input transistor to the output of the amplifier is reduced.

In embodiments of the invention, the circuit comprises a decoupling capacitor connected between the input terminal of the first input transistor and the second topology switching means. Hence, decoupling of alternating current to the first input transistor and second topology switching means is provided.

In some arrangements of the invention, the circuit comprises a decoupling capacitor connected between the feedback resistor and an output of the circuit. Hence, further decoupling of alternating current to the second topology switching means is provided.

In other arrangements of the invention, the circuit comprises a feedback amplifier connected between the feedback resistor and an output of the circuit. Hence, additional buffering to boost performance of the circuit is provided.

In an embodiment of the invention, the first topology comprises a capacitor connected between a first output terminal of the first input transistor and ground. Hence, transconductance stage (comprising 200, 250 and/or 202) PSRR and/or CMRR metrics can be adjusted.

Embodiments of the invention involve the circuit comprising a configurable load, for example an LC (inductor/capacitor) resonator load, connected to a first output of the circuit. The invention therefore allows configuration of transconductance states of the circuit.

In arrangements of the invention, when the low noise amplifier circuit is configured in the second topology, the degeneration inductance is adapted to provide a power supply noise rejection impedance. Hence, the degeneration inductance of the inductively degenerated low noise amplifier topology can be usefully employed in the resistive feedback topology to counter noise effects of a power supply of the circuit.

In an embodiment of the invention, the circuit comprises a second input transistor whereby the low noise amplifier circuit comprises a differential low noise amplifier circuit. The degeneration inductor comprises a centre-tap differential degeneration inductor connected to a first output terminal of the first input transistor, a first output terminal of the second input transistor and ground. The feedback resistance comprises a further feedback resistor connected between the input terminal of the second input transistor and a second output of the circuit. Hence, the invention provides a configurable differential amplifier having associated good common-mode rejection performance.

In embodiments of the invention, the first topology switching means is connected between the first output terminal of the first input transistor and the first output terminal of the second input transistor, and the circuit comprises a third topology switching means (or function) connected between the input terminal of the second input transistor and the further feedback resistor. The circuit is configurable in the first topology by configuring the first, second and third topology switching means in an open state, and the circuit is configurable in the second topology by configuring the first, second and third topology switching means in a closed state. Hence, a further topology switching means can be employed to configure the differential low noise amplifier circuit into an appropriate topology.

In an arrangement of the invention, when the low noise amplifier circuit is configured in the second topology, the degeneration inductance is adapted to provide a common-mode signal rejection impedance in relation to signal components common to the first and second input signals. Hence, the degeneration inductance of the inductively degenerated low noise amplifier topology can be usefully employed in the resistive feedback topology to provide desirable common-mode signal rejection for a differential amplifier.

In accordance with a second aspect of the present invention, there is provided a radio-frequency semiconductor integrated circuit comprising one or more configurable low noise amplifier circuits according to the first aspect of the invention.

In accordance with a third aspect of the present invention, there is provided a radio-frequency module comprising one or more radio-frequency filter circuits coupled to one or more configurable low noise amplifier circuits according to the first aspect of the invention.

In accordance with a fourth aspect of the present invention, there is provided a device comprising a configurable low noise amplifier circuit according to the first aspect of the invention.

In accordance with a fifth aspect of the present invention, there is provided a method of configuring a low noise amplifier circuit comprising applying one of:

a first set of one or more control signals to the circuit to configure the circuit in a first topology in which the low noise amplifier circuit comprises a degeneration inductance whereby the low noise amplifier circuit operates as an inductively degenerated low noise amplifier; or a second set of one or more control signals to the circuit to configure the circuit in a second topology in which the low noise amplifier circuit comprises a feedback resistance whereby the low noise amplifier circuit operates as a resistive feedback low noise amplifier.

In accordance with a sixth aspect of the present invention, there is provided a configurable low noise amplifier circuit, the low noise amplifier circuit being configurable between:

an internal input impedance matching topology in which the low noise amplifier circuit comprises one or more internal input impedance matching components adapted to match the input impedance of the low noise amplifier to a given input, the one or more internal input impedance matching components being located internally to the low noise amplifier circuit; and a topology different from the internal input impedance matching topology.

The topology different from the internal input impedance matching topology may be different from the internal input impedance matching topology in that it does not include the one or more internal input impedance matching components of the internal input impedance matching topology.

Hence, when the configurable low noise amplifier circuit is configured in the internal input impedance matching topology, no external matching components are required for matching the input impedance of the low noise amplifier to a given input. When the configurable low noise amplifier circuit is configured in the topology different from the internal input impedance matching topology, one or more external impedance matching components are required for matching the input impedance of the low noise amplifier to a given input.

Further features and advantages of the invention will become apparent from the following description of preferred embodiments of the invention, given by way of example only, which is made with reference to the accompanying drawings.

DETAILED DESCRIPTION OF THE INVENTION

Several LNA structures are known, each of these having certain benefits and drawbacks regarding their noise performance, overall cost, and input matching capabilities.

A first known LNA topology is the inductively degenerated LNA topology, a detailed analysis of which has been given in, for example, in D. K. Shaeffer and T. H. Lee, "A 1.5-V, 1.5-GHz CMOS low noise amplifier," IEEE J. of Solid-State Circuits, vol. 32, no. 5, May 1997, pp. 745-759.

Figure 1:
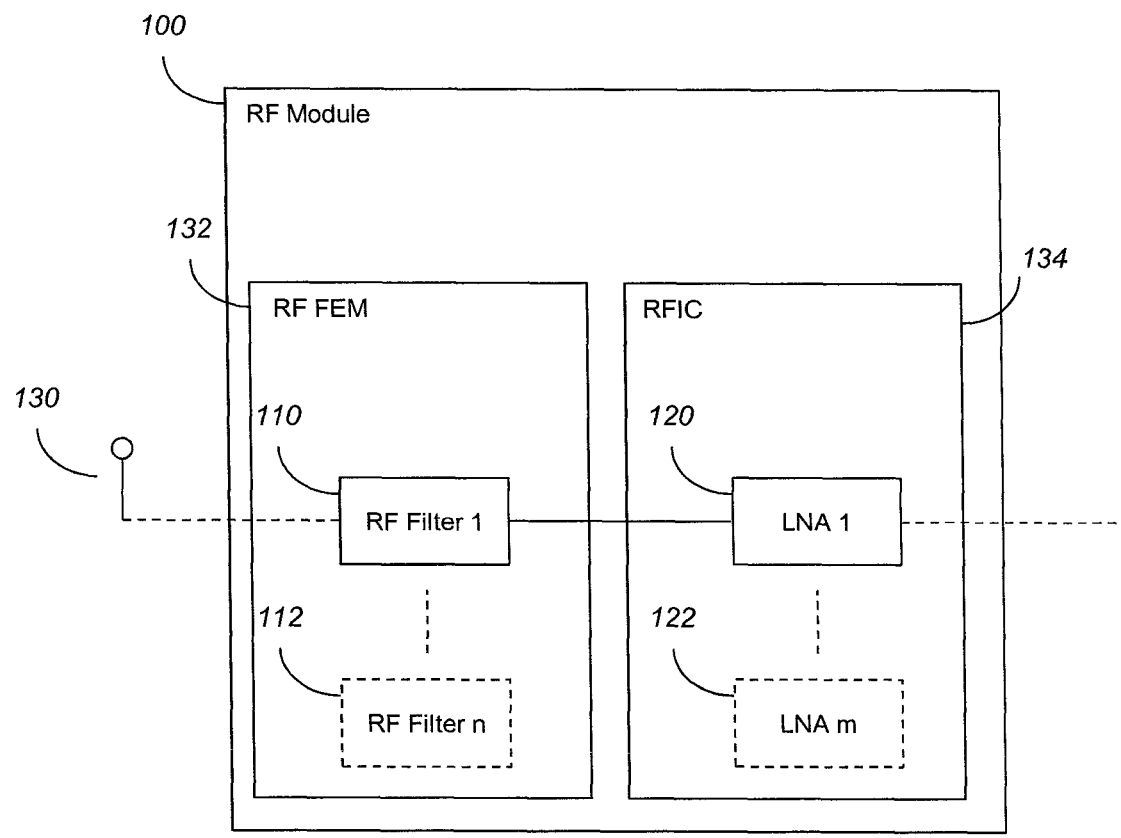
FIG. 1 illustrates a radio-frequency integrated circuit according to the prior art.
Figure 2:
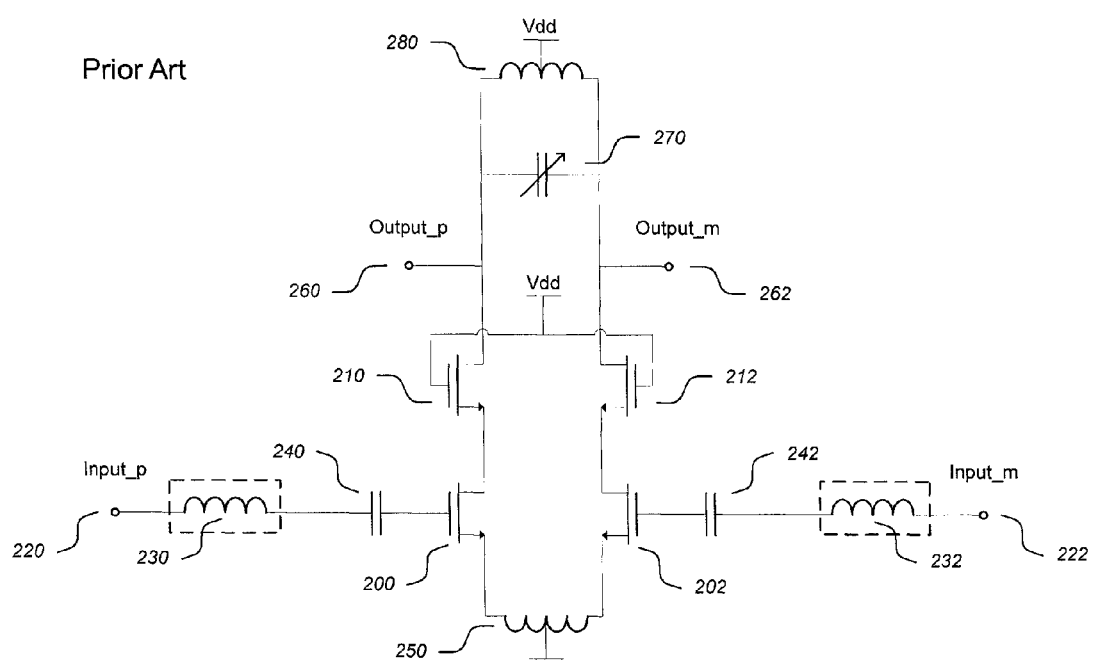
FIG. 2 illustrates an inductively degenerated low noise amplifier circuit according to the prior art.

An exemplary inductively degenerated LNA circuit is depicted in FIG. 2. The LNA of FIG. 2 is a differential amplifier, where transistors 200 and 210 form the positive or 'plus' side of the differential amplifier, and transistors 202 and 212 form the negative or 'minus' side of the differential amplifier. The plus and minus sides of the differential amplifier are each arranged in a cascode configuration, where transistors 200 and 202, each arranged in a common source configuration, form the input transistors of the plus and minus sides, respectively, and transistors 210 and 212 form the cascode transistors of the plus and minus sides, respectively. In this case, each of transistors 200, 202, 210, 212 is an enhancement mode n-channel metal-oxide-semiconductor field-effect transistor (MOSFET), (also referred to as 'NMOS').

The differential amplifier amplifies the difference between the two input signals applied to its input terminals Input_p 220 and Input_m 222, where the signal applied to input terminal Input_m 222 is a signal having the same magnitude as the signal applied to input terminal Input_p 220 but being 180 degrees out of phase with that signal (i.e. the signals have opposite phase). The differential amplifier is able to reject signal components common to both its input signals whilst amplifying the difference between the two signals. The degree to which the differential amplifier rejects signal components common to both its input signals whilst amplifying the difference between the two signals. can be measured by the Common-Mode Rejection Ratio (CMRR) metric.

The gate terminal of input transistor 200 on the plus side of the amplifier is connected to a decoupling capacitor 240 that is in turn connected to an external matching component 230. Input terminal Input_p 220 is connected to external matching component 230. External matching component 230 is located on a separate circuit or device to the circuit containing the LNA of FIG. 2, i.e. matching component 230 is 'off-chip' (denoted by dashed surrounding box in FIG. 2). In this case, matching component 230 is an inductor.

Similarly on the minus side of the amplifier, the gate terminal of input transistor 202 is connected to a decoupling capacitor 242 that is in turn connected to an external matching component 232. Input terminal Input_m 222 is connected to external matching component 232. Again, matching component 232 is located off-chip, and in this case is an inductor.

The gate terminals of input transistors 200 and 202 thus each form an input terminal of their respective input transistor. The source and drain terminals of input transistors 200 and 202 therefore form output terminals of the input transistors.

The source terminal of each of the two input transistors 200, 202 is connected to a different respective terminal of an inductor 250. Inductor 250 is a centre-tap differential inductor device with mutual coupling. Inductor 250 provides inductive degeneration of the source terminals of the two input transistors 200, 202. The centre-tap terminal of inductor 250 is connected to ground.

The drain terminal of input transistor 200 on the plus side of the differential amplifier is connected to the source terminal of cascode transistor 210. Similarly, the drain terminal of input transistor 202 on the minus side of the differential amplifier is connected to the source terminal of cascode transistor 212.

The gate terminals of cascode transistors 210 and 212 are both connected to the circuit voltage supply Vdd (a DC voltage). Note that a gate terminal DC voltage can be set to a level other than Vdd, such that the drain voltage of input transistor 200 can be set to a desired level in order to increase the available voltage swing at the drain terminal of cascode transistor 210.

The drain terminals of cascode transistors 210 and 212 are connected to output terminals Output_p 260 and Output_m 262 respectively, where Output_p is the output terminal of the plus side of the differential amplifier, and Output_m is the output terminal of the minus side of the differential amplifier. The drain terminals of cascode transistors 210 and 212 are also each connected to the voltage supply Vdd via a configurable load; in this case the configurable load comprises an inductor 280 and variable capacitor 270 connected in parallel. Inductor 280 is a centre-tap differential inductor device and its centre-tap terminal is connected to voltage supply Vdd. The output terminals Output_p 260 and Output_m 262 of the LNA of FIG. 2 are thus connected to the configurable load.

The noise performance of the LNA topology depicted in FIG. 2 is typically dominated by the noise performance of input transistors 200 and 202. The noise performance can be improved by optimizing the input matching network (for example including input transistors 200 and 202 and external matching components 230 and 232). In this topology, the input matching network preceding the input transistors provides passive voltage gain which can be measured as a ratio of the voltage swing observed at the gate to source terminal junction of the corresponding input transistor, e.g. 200, and the voltage swing at the LNA input. A high value for this ratio, known in this context as the Q-value of the input matching network, is beneficial in reducing the drain current noise of input transistor 200, but it increases the induced gate current noise of the input transistor. The optimum Q-value can be determined using the following equation:

$$F = 1 + \frac{R_{Lin}}{R_S} + \frac{R_g}{R_S} + \frac{\gamma}{\alpha}\frac{1}{Q_{in}}\left(1 - 2|c|\sqrt{\frac{\delta\alpha^2}{5\gamma}} + \frac{\delta\alpha^2}{5\gamma}\right)\left(\frac{f_0}{f_T}\right) + \frac{\delta\alpha}{5}Q_{in}\left(\frac{f_0}{f_T}\right) \quad (2)$$

In equation (2), $R_{Lin}$, $R_g$, and $R_S$ are, respectively, the series resistance of external matching component 230, the gate resistance of input transistor 200, and the source impedance of transistor 200. The symbols δ, γ, and α are transistor noise parameters, while $Q_{in}$ is the Q-value of the input matching network, and $f_0$ and $f_T$ are the operational and unity-gain frequencies respectively. Finally, c is the correlation coefficient between the drain terminal and gate terminal noises of input transistor 200.

The inductively degenerated LNA of FIG. 2 has a comparatively good noise figure, thereby reducing the noise contribution of the following stages in the receiver, and provides both current and voltage gain. In general, the noise figure of this LNA topology improves along with higher unity-gain frequency.

However, noise parameters γ and δ tend to increase as the transistor channel shortens. Fortunately, some components can be modelled as ratios of noise factors γ and δ which can be considered approximately constant; this is a reasonable assumption, since both noise sources have the same physical origin. Therefore, the increment of noise parameters γ and δ due to the effect of a short-channel is not as severe for an inductively degenerated LNA input stage. However, the inductively degenerated LNA topology requires several off-chip external matching components 230 and 232, and thus tends to be relatively expensive.

A second known LNA topology is the resistive feedback (or 'shunt-resistor') LNA, a detailed analysis of which has been given in C.-F. Liao and S.-I. Liu, "A broadband noise-cancelling CMOS LNA for 3.1-10.6-GHz UWB receivers," IEEE J. of Solid-State Circuits, vol. 42, no. 2, February 2007, pp. 329-339.

Figure 3:
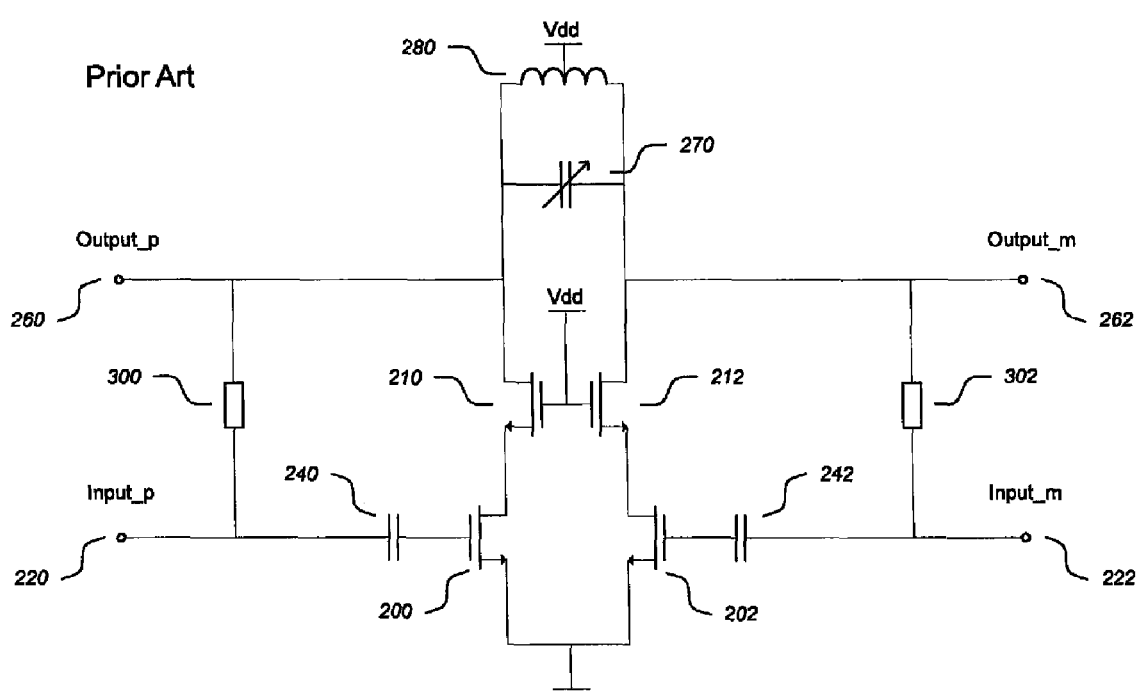
FIG. 3 illustrates a resistive feedback low noise amplifier circuit according to the prior art.

An exemplary resistive feedback LNA circuit is depicted in FIG. 3. As with the inductively degenerated LNA of FIG. 2, the LNA of FIG. 3 is a differential amplifier, where transistors 200 and 210 form the positive or 'plus' side of the differential amplifier, and transistors 202 and 212 form the negative or 'minus' side of the differential amplifier.

The topology of the resistive feedback LNA of FIG. 3 is similar to that of the inductively degenerated LNA of FIG. 2; however, there are several differences as follows:

Firstly, no inductor 250, which provides inductive degeneration of the source terminals of input transistors 200 and 202 in the inductively degenerated LNA of FIG. 2, is present in the resistive feedback LNA of FIG. 3. Instead, the source terminals of input transistors 200 and 202 of the resistive feedback LNA of FIG. 3 are connected directly to ground.

Secondly, output terminal Output_p 260, i.e. the output terminal of the plus side of the differential amplifier, is connected to input terminal Input_p 220, i.e. the input of the plus side of the differential amplifier, via a feedback resistor 300. Similarly, output terminal Output_m 262, i.e. the output terminal of the minus side of the differential amplifier, is connected to input terminal Input_m 222, i.e. the input terminal of the minus side of the differential amplifier, via a feedback resistor 302. Feedback resistors 300 and 302 thus provide resistive feedback to the plus and minus sides of the differential amplifier, respectively.

Thirdly, an important difference between these LNA topologies is the configurability of the input matching frequency. In the resistive feedback topology, the optimum input matching frequency follows the output swing at the output. When the gain at the resistive feedback LNA output is set to the desired frequency by tuning a resonator load applied to the output, the input matching is observed at the same frequency. This can be understood by calculating the input impedance value of the resistive feedback topology which is approximately defined by $Z_{in}=(R_{fb}+Z_L)/(1+G_m*Z_L)$, where $R_{fb}$ is the feedback resistor value, $Z_L$ is the load impedance and $G_m$ is the transconductance of the input device. This is in contrast to the input matching of the inductively degenerated LNA topology which is generally more fixed to a certain frequency.

Finally, no external matching components 230 and 232 are provided in the resistive feedback LNA of FIG. 3. Input transistors 200 and 202 are thus directly connected to the Input_p 220 and Input_m 222 terminals, respectively, via decoupling capacitors 240 and 242, respectively.

Rather than requiring external matching components in order to match the impedance to which the input terminals Input_p 220 and Input_m 222 are connected (where the impedance to be matched to is for example the output impedance of an RF filter preceding the LNA), the resistive feedback LNA of FIG. 3 is capable of matching the impedance connected to input terminals Input_p 220 and Input_m 222 internally within the LNA.

There are no external matching components 230 and 232 present in the resistive feedback LNA of FIG. 3 that provide a passive voltage gain prior to capacitors 240 and 242, as described above for the inductively degenerated LNA of FIG. 2, so the noise effects of input transistors 200 and 202 are not mitigated. In addition, there are additional noise sources in the resistive feedback LNA of FIG. 3 due to the feedback loops between the output terminals 260 and 262 and input terminals 220 and 222 of the LNA. The input referred noise from both the configurable load and the feedback loops increases as the resistance of feedback resistors 300 and 302 decreases.

In general, the noise performance of the resistive feedback LNA of FIG. 3 is worse compared to the inductively degenerated LNA of FIG. 2. However, since the resistive feedback LNA of FIG. 3 does not require external matching components 230 and 232, nor inductor 250 for inductive degeneration, the overall cost of the resistive feedback LNA of FIG. 3 is lower compared to that of the inductively degenerated LNA of FIG. 2.

The present invention relates to an LNA circuit that can be configured between one of a first topology in which the low noise amplifier circuit comprises a degeneration inductance such that the low noise amplifier circuit operates as an inductively degenerated low noise amplifier, and a second topology in which the low noise amplifier circuit comprises a feedback resistance such that the low noise amplifier circuit operates as a resistive feedback low noise amplifier. In the first topology, external matching components are used in conjunction with the LNA for input impedance matching purposes. In the second topology, input impedance matching is carried out using components internal to the LNA topology; no external matching components are required in the second topology. Input impedance matching may for example involve matching to the output impedance of an RF filter connected to one or more inputs of the LNA.

Figure 4:
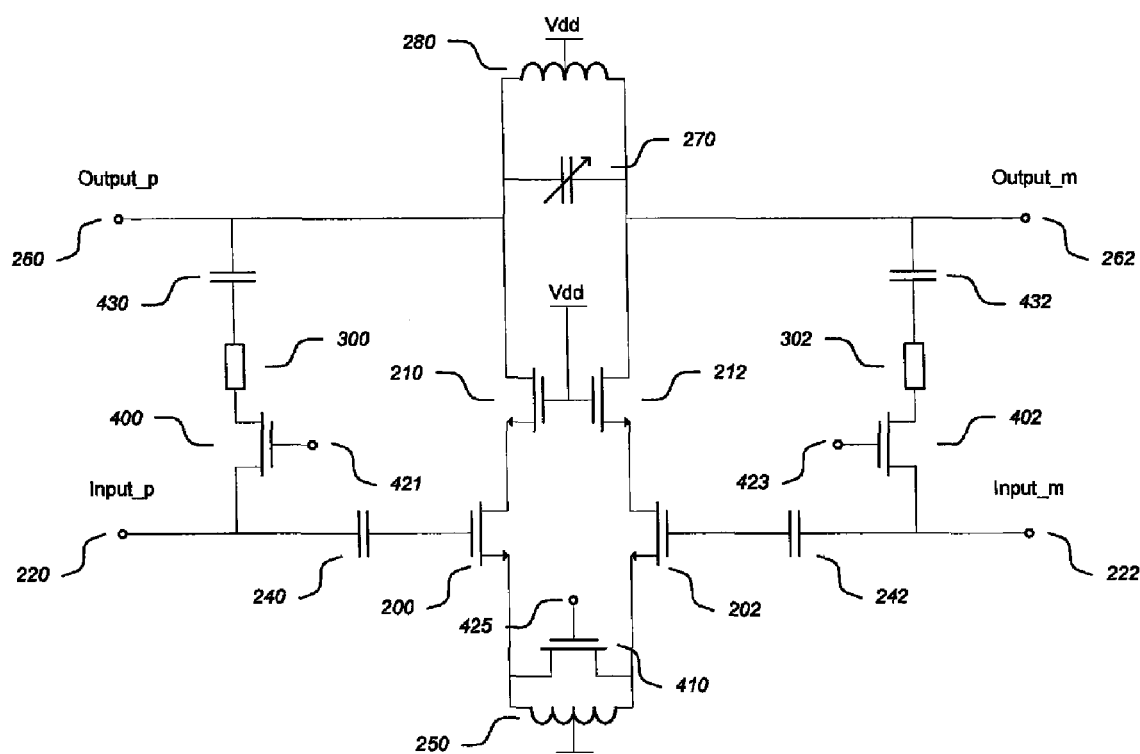
FIG. 4 illustrates a configurable low noise amplifier according to an embodiment.

An exemplary configurable LNA circuit according to the invention is illustrated in FIG. 4. As with the LNAs of FIG. 2 and FIG. 3, the exemplary LNA of FIG. 4 is a differential amplifier, where transistors 200 and 210 form the positive or 'plus' side of the differential amplifier, and transistors 202 and 212 form the negative or 'minus' side of the differential amplifier.

The topology of the configurable LNA of FIG. 4 necessarily contains some similar features to both the inductively degenerated low noise amplifier of FIG. 2 and the resistive feedback LNA of FIG. 3; however, there are several important differences which include the following:

Firstly, the configurable LNA of FIG. 4 contains a switching arrangement for configuring the LNA between one of the first topology and the second topology. The switching arrangement contains a number of topology switching means.

Secondly, similarly to the resistive feedback LNA of FIG. 3, the configurable LNA of FIG. 4 includes feedback resistor 300 on the plus side of the differential amplifier. However, rather than feedback resistor 300 on the plus side of the differential amplifier being connected directly to input terminal Input_p 220, feedback resistor 300 is connected to a topology switching means, in this case switching transistor 400, that is in turn connected to input terminal Input_p 220. One of the drain terminal and source terminal of switching transistor 400 is connected to feedback resistor 300, whilst the other terminal is connected to input terminal Input_p 220. The gate terminal of switching transistor 400 is connected to a configuration control signal terminal 421. Topology switching means 400 is thus connected between the gate of input transistor 200 (via decoupling capacitor 240) and feedback resistor 300.

Thirdly, similarly to the resistive feedback LNA of FIG. 3, the configurable LNA of FIG. 4 includes feedback resistor 302 on the minus side of the differential amplifier. However, rather than feedback resistor 302 on the minus side of the differential amplifier being connected directly to input terminal Input_m 222, feedback resistor 302 is connected to a topology switching means, in this case switching transistor 402, that is in turn connected to input terminal Input_m 222. One of the drain terminal and source terminal of switching transistor 402 is connected to feedback resistor 302, whilst the other terminal is connected to input terminal Input_m 222. The gate terminal of switching transistor 402 is connected to a configuration control signal terminal 423. Topology switching means 402 is thus connected between the gate of input transistor 202 (via the decoupling capacitor 242) and feedback resistor 302.

Fourthly, similarly to the inductively degenerated LNA of FIG. 2, an inductor 250 is present in the configurable LNA of FIG. 4.

Fifthly, a topology switching means, in this case a switching transistor 410, is connected between the source terminals of input transistors 200 and 202. One of the drain terminal and source terminal of switching transistor 410 is connected to the source terminal of input transistor 200, whilst the other terminal is connected to the source terminal of input transistor 202. The gate terminal of switching transistor 410 is connected to a configuration control signal terminal 425.

Sixthly, decoupling capacitors 430 and 432 provide decoupling of the voltage supply to ground potential for switching transistors 400 and 402 respectively.

By applying appropriate configuration control signals to configuration control terminals 421, 423 and 425, switching transistors 400, 402 and 410 can be switched between an open state, whereby the configurable LNA of FIG. 4 is configured in the first topology, and a closed state, whereby the configurable LNA of FIG. 4 is configured in the second topology. The first and second topologies that can be configured by using the topology switching means will now be described in more detail.

In the first topology, switching transistors 400, 402 and 410 are configured to an open state. When in an open state, a switching transistor provides a high resistance between its drain and source terminals which effectively disconnects (or 'open-circuits') the drain and source terminals. A switching transistor may be placed in the open state by applying an appropriate control signal to the respective configuration control signal terminal such that the voltage between the gate terminal and the source terminal (i.e. the voltage $V_{gs}$) of the switching transistor is less (or approximately less) than the threshold voltage (i.e. the voltage $V_t$) of the switching transistor, i.e. a switching transistor may thus be described as being in cutoff mode. A configuration control signal for configuring a switching transistor into an open state may for example comprise a digital '0' signal (such as a signal comprising a first voltage level).

By configuring switching transistors 400 and 402 to an open state, feedback resistors 300 and 302 are effectively disconnected from the input signals applied to input terminals Input_p 220 and Input_m 222, respectively.

As a result, there is no feedback loop present between the output terminals Output_p 260 and Output_m and the input terminals Input_p 220 and Input_m 222, respectively.

By configuring switching transistor 410 to an open state, the source terminals of input transistors 200 and 202 are effectively connected only via inductor 250, whose centre-tap is connected to ground. Inductor 250 therefore provides inductive degeneration of the source terminals of input transistors 200 and 202, as in the inductively degenerated LNA of FIG. 2.

The configurable LNA thus operates as an inductively degenerated LNA when switching transistors 400, 402 and 410 are switched to an open state, i.e. when the configurable LNA is configured in the first topology.

Therefore, when configured in the first topology, the configurable LNA does not provide internal input impedance matching, for example matching to the output impedance of a preceding RF filter connected to input terminals Input_p 220 and Input_m 222. As a result, the input impedance of the configurable LNA of FIG. 4 should be matched, for example to a preceding RF filter, by connecting external impedance matching components, for example external matching components 230 and 232 as depicted in the inductively degenerated LNA of FIG. 2, in-between decoupling capacitors 240, 242 and input terminals Input_p 220 and Input_m 222 respectively.

The first topology of the configurable LNA of FIG. 4 thus provides the benefits of the inductively degenerated LNA of FIG. 2, i.e. relatively low noise figure, but requires the use of external matching components in order to provide input impedance matching.

In the second topology, switching transistors 400, 402 and 410 are configured to a closed state. When in a closed state, a switching transistor provides a low resistance between its drain and source terminals which effectively connects (or 'short-circuits') the drain and source terminals. A switching transistor can be placed in the closed state by applying a configuration control signal to its control signal terminal such that the voltage between the gate terminal and the source terminal (i.e. the voltage $V_{gs}$) of the switching transistors is greater than the threshold voltage (i.e. the voltage $V_t$) of the switching transistor, i.e. a switching transistor may thus be described as being in triode mode. A configuration control signal for configuring a switching transistor into a closed state may for example comprise a digital '1' (such as a signal comprising a second voltage level)

By configuring switching transistors 400 and 402 to a closed state, feedback resistors 300 and 302 are effectively connected to the input terminals Input_p 220 and Input_m 222, respectively. As a result, a feedback loop is present between output terminals Output_p 260 and Output_m and input terminals Input_p 220 and Input_m 222, respectively (and thus the input terminals of input transistors 200 and 202, respectively, via decoupling capacitors 240 and 242).

The configurable LNA thus operates as a resistive feedback LNA when switching transistors 400, 402 and 410 are configured to a closed state, i.e. when the configurable LNA is configured in the second topology.

Therefore, when configured in the second topology, the configurable LNA provides internal input impedance matching, for example matching to the output impedance of a preceding RF filter connected to input terminals Input_p 220 and Input_m 222. As a result, external matching components, for example external matching components 230 and 232 as depicted in the inductively degenerated LNA of FIG. 2, are not required when the configurable LNA is configured in the second configuration state.

When the configurable LNA of FIG. 4 is configured in the second topology, switching transistor 410 is configured to a closed state; this provides additional benefits, as will now be described.

By configuring switching transistor 410 to a closed state, the source terminals of the input transistors 200 and 202 are effectively connected (i.e. short-circuited). The connection formed by switching transistor 410 between the source terminals of input transistors 200 and 202 is in parallel to inductor 250 which connects the source terminals of the input transistors 200 and 202.

As in the inductively degenerated LNA of FIG. 2, inductor 250 is a differential inductor device with mutual coupling. The mutual coupling of the differential inductor device causes the inductor to operate differently for common-mode signals applied to the differential amplifier, compared to differential-mode signals applied to the differential amplifier.

Common-mode signals applied to the differential amplifier are signal components that have the same magnitude and same phase in the respective input signals applied to input terminals Input_p 220 and Input_m 222. In contrast, differential-mode signals are signal components that have the same magnitude and opposite phase in the respective input signals applied to input terminals Input_p 220 and Input_m 222.

For differential-mode signals that are applied to the input terminals Input_p 220 and Input_m 222, when the configurable LNA is configured in the second topology, the connection formed by switching transistor 410 between the source terminals of input transistors 200 and 202 forms a virtual ground for the differential signal.

However in relation to common-mode signals that are applied to the input terminals Input_p 220 and Input_m 222, when the configurable LNA is configured in the second topology, inductor 250 remains active, providing an inductance equivalent to:

$$(1-k)/2 * L_n \qquad (3)$$

between the source terminals of input transistors 200 and 202 and ground (which is connected to the centre-tap of inductor 250), where k is the mutual coupling coefficient of inductor 250, and $L_n$ is a nominal inductance based on the electrical length of inductor 250.

Thus, when the configurable LNA is configured in the second topology, the inductance provided by inductor 250 (as per equation (3) above) in relation to common-mode signals forms an impedance that serves to attenuate interference and other noise from the ground voltage supply. The power supply noise rejection performance, for example as demonstrated by a higher Power Supply Rejection Ratio (PSRR) metric, of the configurable LNA when configured in the second topology is thus improved. The degeneration inductance provided by inductor 250 is thus adapted to provide a power supply noise rejection impedance when the configurable LNA is configured in the second topology.

Such improvements in the PSRR metric are typically only seen in inductively degenerated LNA topologies such as that of FIG. 2. However, the configurable LNA enables such improvements in a resistive feedback LNA topology by 'borrowing' the inductor 250 from the inductively degenerated LNA topology. The 'borrowing' of inductor 250 also ensures that an expensive (in terms of chip area) on-chip component from the first topology of the configurable LNA is used in both configurations of the configurable LNA.

Additionally, when the configurable LNA is configured in the second topology, the inductance provided by inductor 250 (as per equation (3) above) in relation to common-mode signals forms a degeneration inductor for the source terminals of input transistors 200 and 202. As described above in relation to the inductively degenerated LNA of FIG. 2, such a degeneration inductor serves to improve the common-mode rejection performance, for example as demonstrated by a higher CMRR metric, of the configurable LNA when configured in the second topology. The degeneration inductance provided by inductor 250 is thus adapted to provide a common-mode signal rejection impedance in relation to signal components common to input signals applied to input terminals Input_p 220 and Input_m 222 when the configurable LNA is configured in the second topology.

Such improvements in the CMRR metric are typically only seen in inductively degenerated LNA topologies such as that of FIG. 2. However, the configurable LNA enables such improvements in a resistive feedback LNA topology by 'borrowing' the inductor 250 from the inductively degenerated LNA of FIG. 2. The 'borrowing' of the inductor 250 also ensures that an expensive (in terms of chip area) on-chip component from the first topology of the configurable LNA is used in both configurations of the configurable LNA.

The configurable LNA of FIG. 4 thus provides an LNA that can be configured according to the desired use case or design requirements.

The LNA can be configured in the second topology if a more sensitive LNA with a better noise figure is required, at the cost of a need for external matching components, e.g. 230 and 232, in order to provide impedance matching for the inputs of the configurable LNA.

Alternatively, the LNA can be configured in the second topology in order to provide a more cost effective solution.

Additionally, when the configurable LNA is configured in the second topology, the use of inductor 250 provides an improvement in the PSRR and CMRR of the LNA over the resistive feedback LNA of FIG. 3. This results in the re-use of an expensive on-chip component (i.e. inductor 250) that can consume a significant amount of chip area of the configurable LNA.

The configurable LNA may be configured by its manufacturer, or by a third party installing the configurable LNA, for example in a device or module thereof; this may involve a method of configuring the LNA that comprises applying either a first set of one or more control signals to the LNA to configure it in the first topology or a second set of one or more control signals to the LNA to configure it in the second topology. A set of control signals may for example be applied to one or more of the switching transistors.

The configurable LNA of FIG. 4 can be implemented in a radio-frequency semiconductor integrated circuit (RFIC). Such an RFIC may be included in an RF module comprising an RF filter located in an RF Front End Module preceding the LNA. The RFIC may comprise input and output pins that may be used to connect external matching components between the configurable LNA and the RF filter. An RFIC could alternatively comprise one or more RF filters connected to one or more configurable LNAs.

The configurable LNA of FIG. 4 can be incorporated in a number of different devices. Such a device could comprise a user equipment such as a mobile station, personal digital assistant or cellular telephony device etc.; the configurable LNA may for example be included in a receiver of such a user equipment. Further, such a device could comprise a modem device to be attached to a user equipment, for example a USB modem. Still further, such a device could comprise a communication module such as a Machine-to-Machine (M2M) module which can be inserted into another device such as a laptop computer or other device with communication capability (for example a vending machine). Yet, still further, such a device could comprise a chipset which may include radio and baseband parts.

The above embodiments are to be understood as illustrative examples of the invention. Further embodiments of the invention are envisaged, some examples of which follow here.

In a first alternative arrangement, cascode transistors 210 and 212 are not included in the configurable LNA circuit of FIG. 4. In such an arrangement, on the plus side of the differential amplifier, the drain terminal of input transistor 200 is connected to output terminal Output_p 260 of the configurable LNA and to the configurable load (e.g. inductor 280 and variable capacitor 270) that is connected to the voltage supply Vdd. Similarly, on the minus side of the differential amplifier, the drain terminal of input transistor 202 is connected to output terminal Output_m 262 of the configurable LNA and to the configurable load that is connected to the voltage supply Vdd. The omission of the cascode transistors 210 and 212 may degrade the input-output isolation of the invention and worsen the Miller effect of the configurable LNA; however such an arrangement still benefits from the other advantages of the configurable LNA of FIG. 4 described above.

In a second alternative arrangement, only one side of the differential amplifier is included in the configurable LNA circuit of FIG. 4, for example either the plus side or the minus side. In such an arrangement only one input terminal, e.g. Input_p 220, and only one output terminal, e.g. Output_p, are included in the configurable LNA circuit. Additionally, degeneration inductor 250 is connected between the source terminal of the input transistor (e.g. 200) of the configurable LNA and ground. Finally, the source and drain terminals of switching transistor 410 are connected such that when the switching transistor 410 is in a closed state, the source terminal of input transistor 200 is effectively connected to ground. This arrangement thus does not comprise a differential amplifier and does not benefit from the common-mode rejection capabilities of a differential amplifier; however such an arrangement still benefits from the other advantages of the LNA of FIG. 4 described above.

Figure 5:
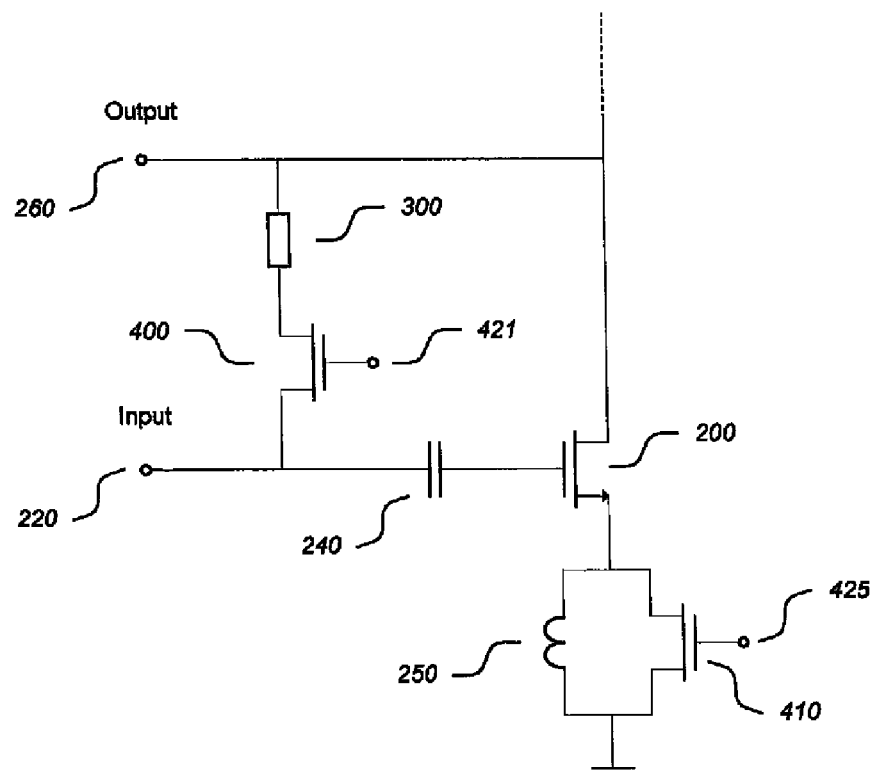
FIG. 5 illustrates a configurable low noise amplifier according to an embodiment.

An exemplary configurable LNA circuit combining the first alternative arrangement above where the cascode transistors are omitted, and the second arrangement above where only one side of the differential amplifier of the configurable LNA circuit of FIG. 4 is included, is illustrated in FIG. 5. This arrangement still benefits from the many of the advantages of the LNA of FIG. 4 described above.

In a yet further alternative embodiment, switching transistor 410 is not included in the configurable LNA circuit. The source terminals of transistors 200 and 202 thus remain connected to respective terminals of the inductor 250 in both the first and second topologies of the configurable LNA. Different types of topology switching means may be used with any of the embodiments described above. For example, as opposed to n-type enhancement mode MOSFETs, p-type and/or depletion mode MOSFETs may be used. In another example, bipolar junction transistors may be used.

In further alternative embodiments, topology switching means other than switching transistors can be employed, for example mechanical switches which can be physically switched to configure the configurable LNA in the desired topology. Further, alternatively, electromagnetically operated relays could be employed as topology switching means.

In another further alternative embodiment, the inductor 250 may not be a differential inductor with centre tap connected to ground, but instead may be replaced by two inductors. In this case, the first of these inductors connects between the source terminal of input transistor 200 (on the plus side of the differential amplifier) and ground, and the second of these inductors connects between the source terminal of input transistor 202 (on the minus side of the differential amplifier) and ground.

De-coupling capacitors 240 and 242 may be omitted from any of the embodiments described above.

The configurable load, e.g. resonator load formed by inductor 280 and variable capacitor 270, may be removed from the circuit or alternatively replaced with another impedance such as a non-resonator load, wideband load, active load etc.

In a yet further alternative embodiment, the configuration control signals applied to configuration control terminals 421, 423, 425 may be provided by an RFIC containing the configurable LNA of FIG. 4. For example, one or more topology switching means may be used to connect configuration control terminals 421, 423, 425 to an appropriate voltage supply (e.g. Vdd for one configuration and ground for another configuration) of the RFIC, in order to configure the LNA in either the first topology or the second topology. In another example, one or more non-volatile memory devices may be configured to provide the configuration control signals, for example the output of a static random access memory (SRAM) device, flash memory device or Electrically Erasable Programmable Read-Only Memory (EEPROM) device may provide the configuration control signals. Such a non-volatile memory device could be externally programmed to store appropriate data (e.g. a '0' bit or a '1' bit) in order to allow the memory device to provide configuration control signals that configure the LNA in either the first topology or the second topology. The method of configuring the LNA may in this case include applying a set of control signals to the LNA by programming the above non-volatile memory device appropriately.

Figure 6:
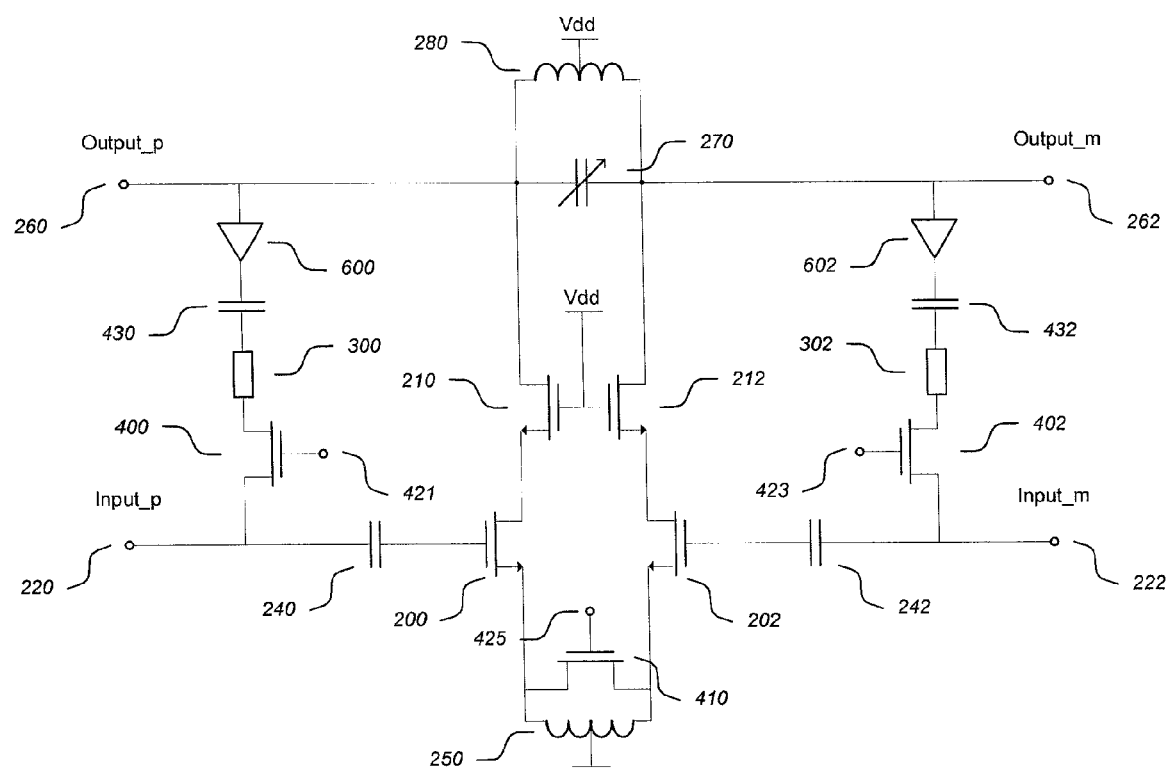
FIG. 6 illustrates a configurable low noise amplifier according to an embodiment.

In yet another alternative embodiment, the feedback loop between input and output of the configurable LNA circuit utilises an amplifying stage in addition to the resistive feedback in order to provide additional buffering to boost overall performance of the circuit. An example of such a configurable LNA circuit is depicted in FIG. 6. FIG. 6 contains similar components to those depicted in FIG. 4, except that the input for the feedback amplifier 600 on the plus side of the circuit is connected to the output of the configurable LNA, and the output of the feedback amplifier is driving feedback resistor 300, which is turn connected to the gate of input transistor 200; a feedback amplifier 602 is similarly connected in the feedback loop on the minus side of the circuit.

Figure 7:
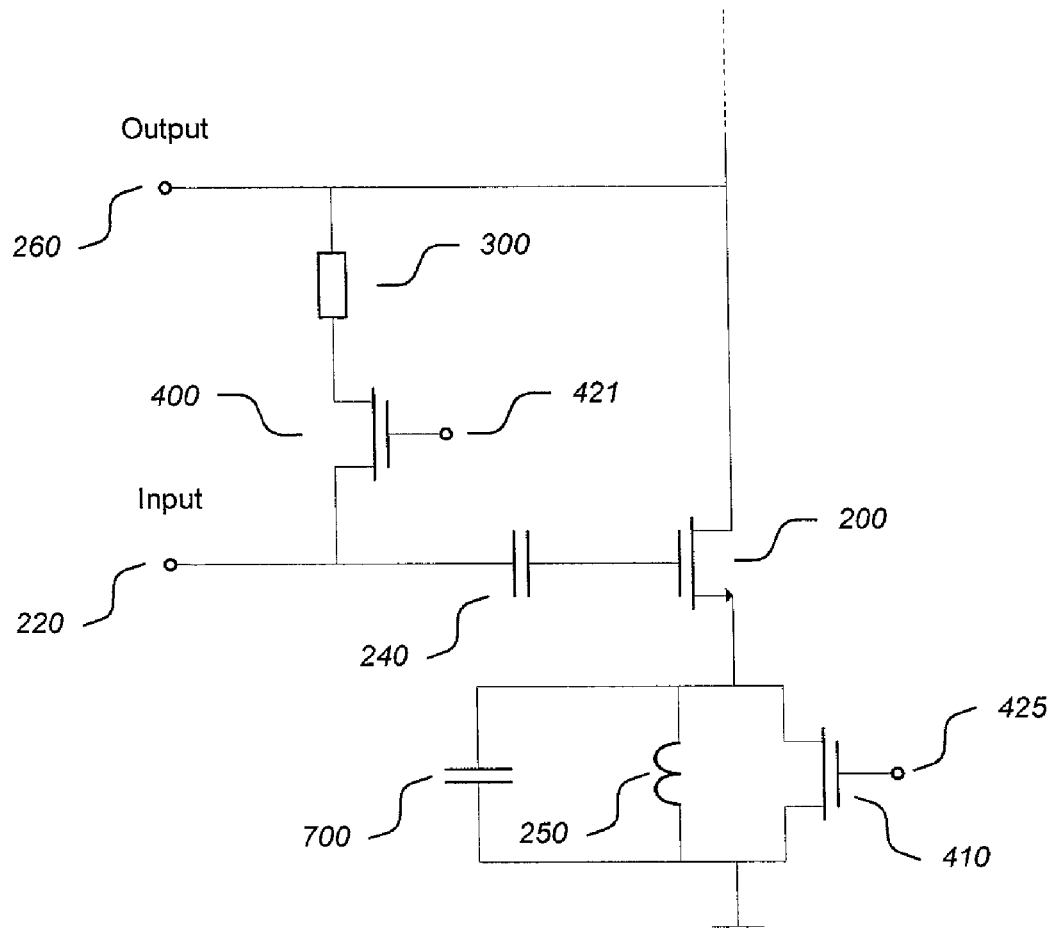
FIG. 7 illustrates a configurable low noise amplifier according to an embodiment.

Another alternative embodiment involves adding, in addition to the configurable degeneration inductance, a configurable capacitor at the source terminal of the input transistor(s) of the configurable LNA, for example as per capacitor 700 shown in FIG. 7. This allows setting of the resonator frequency at the source terminal to a desired frequency and also allows adjustment of the PSRR and/or CMRR metrics.

In a further embodiment, since the input matching network of the configurable LNA gives passive gain in the inductively degenerated topology, the current consumption in the inductively degenerated topology can be smaller than in the resistive feedback topology. This means that different bias points for input transistors or alternate transistor sizes can be used in the different topology configurations to trade-off between current consumption and performance.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A configurable low noise amplifier circuit, the low noise amplifier circuit being configurable between one of:
a first topology in which the low noise amplifier circuit comprises a degeneration inductance whereby the low noise amplifier circuit operates as an inductively degenerated low noise amplifier; and
a second topology in which the low noise amplifier circuit comprises a feedback resistance whereby the low noise amplifier circuit operates as a resistive feedback low noise amplifier;
the configurable low noise amplifier further comprising:
a switching arrangement which operatively configures the configurable low noise amplifier circuit between the first topology and the second topology,
wherein when the configurable low noise amplifier circuit is operatively configured in the second topology, the switching arrangement provides an electrical by-pass of the degeneration inductance of the first topology, and
wherein the configurable low noise amplifier circuit further comprises a first switching transistor, the degeneration inductance being operatively coupled in parallel with the first switching transistor.

2. A configurable low noise amplifier circuit according to claim 1, wherein the low noise amplifier comprises a first input transistor, and the degeneration inductance comprises a degeneration inductor connected between a first output terminal of the first input transistor and ground.

3. A configurable low noise amplifier circuit according to claim 1, wherein the low noise amplifier comprises a first input transistor, and the feedback resistance comprises a feedback resistor connected between the input terminal of the first input transistor and a first output of the circuit.

4. A configurable low noise amplifier circuit according to claim 3, wherein the switching arrangement comprises:
a first topology switching function which comprises the first switching transistor connected between a first output terminal of the first input transistor and ground; and
a second topology switching function which comprises a second switching transistor connected between the input terminal of the first input transistor and the feedback resistor,
wherein the circuit is configurable in the first topology by configuring the first and second topology switching functions in an open state, and
wherein the circuit is configurable in the second topology by configuring the first and second topology switching functions in a closed state.

5. A configurable low noise amplifier circuit according to claim 4,
wherein each of the switching transistors is configurable in the open state via input of an open state configuration control signal to the input terminal of the respective switching transistor, and
wherein each of the switching transistors is configurable in the closed state via input of a closed state configuration control signal to the input terminal of the respective switching transistor.

6. A configurable low noise amplifier circuit according to claim 2, the circuit comprising a first cascode transistor connected to a second output terminal of the first input transistor and a first output of the circuit.

7. A configurable low noise amplifier circuit according to claim 4, the circuit comprising a decoupling capacitor connected between the input terminal of the first input transistor and the second topology switching function.

8. A configurable low noise amplifier circuit according to claim 3, the circuit comprising a decoupling capacitor connected between the feedback resistor and an output of the circuit.

9. A configurable low noise amplifier circuit according to claim 3, the circuit comprising a feedback amplifier connected between the feedback resistor and an output of the circuit.

10. A configurable low noise amplifier circuit according to claim 2, wherein the first topology comprises a capacitor connected between a first output terminal of the first input transistor and ground.

11. A configurable low noise amplifier circuit according to claim 1, the circuit comprising a configurable load connected to a first output of the circuit.

12. A configurable low noise amplifier circuit according to claim 1, wherein when the low noise amplifier circuit is configured in the second topology, the degeneration inductance is adapted to provide a power supply noise rejection impedance.

13. A configurable low noise amplifier circuit according to claim 1, the circuit comprising a second input transistor whereby the low noise amplifier circuit comprises a differential low noise amplifier circuit.

14. A configurable low noise amplifier circuit according to claim 13, wherein the degeneration inductor comprises a centre-tap differential degeneration inductor connected to a first output terminal of the first input transistor, a first output terminal of the second input transistor and ground.

15. A configurable low noise amplifier circuit according to claim 13, wherein the feedback resistance comprises a further feedback resistor connected between the input terminal of the second input transistor and a second output of the circuit.

16. A configurable low noise amplifier circuit according to claim 13, wherein the first topology switching function is connected between the first output terminal of the first input transistor and the first output terminal of the second input transistor, the circuit comprising:
  a third topology switching function connected between the input terminal of the second input transistor and the further feedback resistor,
  wherein the circuit is configurable in the first topology by configuring the first, second and third topology switching functions in an open state, and
  wherein the circuit is configurable in the second topology by configuring the first, second and third topology switching functions in a closed state.

17. A configurable low noise amplifier circuit according to claim 13, wherein when the low noise amplifier circuit is configured in the second topology, the degeneration inductance is adapted to provide a common-mode signal rejection impedance in relation to signal components common to the first and second input signals.

18. A radio-frequency semiconductor integrated circuit comprising one or more configurable low noise amplifier circuits according to claim 1.

19. A radio-frequency module comprising one or more radio-frequency filter circuits coupled to one or more configurable low noise amplifier circuits according to claim 1.

20. A device comprising a configurable low noise amplifier circuit according to claim 1.

21. A method of configuring a low noise amplifier circuit comprising selectively applying one of:
  a first set of one or more control signals to the circuit to configure the circuit in a first topology in which the low noise amplifier circuit comprises a degeneration inductance whereby the low noise amplifier circuit operates as an inductively degenerated low noise amplifier; and
  a second set of one or more control signals to the circuit to configure the circuit in a second topology in which the low noise amplifier circuit comprises a feedback resistance whereby the low noise amplifier circuit operates as a resistive feedback low noise amplifier,
  wherein when the configurable low noise amplifier circuit is configured in the second topology, a switching arrangement provides an electrical by-pass of the degeneration inductance of the first topology, and
  wherein the configurable low noise amplifier circuit further comprises a first switching transistor, the degeneration inductance being operatively coupled in parallel with the first switching transistor.

22. A configurable low noise amplifier circuit, the low noise amplifier circuit being configurable between:
  a first internal input impedance matching topology in which the low noise amplifier circuit comprises one or more internal input impedance matching components adapted to match the input impedance of the low noise amplifier to a given input, the one or more internal input impedance matching components being a portion of the low noise amplifier circuit; and
  a second topology different from the first internal input impedance matching topology and which comprises a degeneration inductance,
  the configurable low noise amplifier circuit further comprising:
  a switching arrangement which operatively configures the configurable low noise amplifier circuit between the first internal input matching topology and the second topology,
  wherein when the configurable low noise amplifier circuit is configured in the first topology, the switching arrangement provides an electrical by-pass of the degeneration inductance of the second topology, and
  wherein the configurable low noise amplifier circuit further comprises a first switching transistor, the degeneration inductance being operatively coupled in parallel with the first switching transistor.

23. A configurable low noise amplifier circuit according to claim 22, wherein the second topology different from the first internal input impedance matching topology in that the second topology does not include the one or more internal input impedance matching components of the first internal input impedance matching topology.

* * * * *

UNITED STATES PATENT AND TRADEMARK OFFICE
CERTIFICATE OF CORRECTION

PATENT NO. : 8,378,748 B2
APPLICATION NO. : 13/111423
DATED : February 19, 2013
INVENTOR(S) : Jari Johannes Heikkinen et al.

It is certified that error appears in the above-identified patent and that said Letters Patent is hereby corrected as shown below:

In the Claims:

Col. 18, Lines 43-48, In Claim 23, "is" is missing between "the second topology" and "different". Claim 23 should read as follows:

--23. A configurable low noise amplifier circuit according to claim 22, wherein the second topology is different from the first internal input impedance matching topology in that the second topology does not include the one or more internal input impedance matching components of the first internal input impedance matching topology.--

Signed and Sealed this
Fourteenth Day of May, 2013

Teresa Stanek Rea
*Acting Director of the United States Patent and Trademark Office*